United States Patent
Ejima

(10) Patent No.: US 7,135,659 B2
(45) Date of Patent: Nov. 14, 2006

(54) HEAT TREATMENT METHOD AND HEAT TREATMENT SYSTEM

(75) Inventor: Tomomi Ejima, Shiroyama-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 37 days.

(21) Appl. No.: 10/469,506

(22) PCT Filed: Mar. 4, 2002

(86) PCT No.: PCT/JP02/01972

§ 371 (c)(1),
(2), (4) Date: Sep. 2, 2003

(87) PCT Pub. No.: WO02/071459

PCT Pub. Date: Sep. 12, 2002

(65) Prior Publication Data

US 2004/0087185 A1    May 6, 2004

(30) Foreign Application Priority Data

Mar. 5, 2001    (JP) ............................... 2001-60442

(51) Int. Cl.
*H05B 1/02*    (2006.01)
(52) U.S. Cl. ...................... 219/497; 219/494; 392/416; 118/725; 438/795
(58) Field of Classification Search ................ 219/497, 219/499, 501, 494; 392/416–418; 118/715, 118/723, 724, 725; 438/795, 799; 700/121
See application file for complete search history.

(56) References Cited

U.S. PATENT DOCUMENTS 6,793,734 B1 *   9/2004   Takagi ........................ 118/715

2003/0045961 A1 *   3/2003   Nakao ........................ 700/121
2004/0053516 A1 *   3/2004   Nakada et al. .............. 438/795

FOREIGN PATENT DOCUMENTS

JP        56-085101      7/1981
JP        8-288230       11/1996

* cited by examiner

*Primary Examiner*—Mark Paschall
(74) *Attorney, Agent, or Firm*—Smith, Gambrell & Russell, LLP

(57) ABSTRACT

Upon performing a heat treatment by heating a semiconductor wafer positioned inside a reaction vessel with a heater provided outside the reaction vessel and supplying a processing gas into the reaction vessel, to increase the temperature inside the reaction vessel promptly to reach a processing temperature to be stabilized after the wafer is carried into the reaction vessel, and to reduce the burden to the operator caused in the heating control adjustment.

The internal temperature inside the reaction vessel and the external temperature as a heater temperature are interpolated at a predetermined mixing ratio, and a first computing unit and a second computing unit are provided so that, in the heating process, the output value of the first computing unit is used firstly, and the output value of the second computing unit is interpolated intermediately while the interpolation ratio of the output value of the second computing unit gradually increases, and the output value of the second computing unit is used 100% finally, said first computing unit obtaining output values that correspond to the deviations between the interpolated values and a preset temperature values, said second computing unit functioning as a cascade control unit by obtaining the internal temperature through the major loop and the internal temperature through the minor loop.

14 Claims, 7 Drawing Sheets

HEAT TREATMENT METHOD AND HEAT TREATMENT SYSTEM

TECHNICAL FIELD

The present invention relates to a heat treatment method and a heat treatment apparatus for heat-treating an object-to-be-treated such as a semiconductor wafer for example.

BACKGROUND ART

A vertical heat treatment apparatus is an apparatus for a heat treatment of a semiconductor wafer (hereinafter referred to as a "wafer"), such as a CVD (chemical vapor deposition) film formation, oxidation processing or diffusion processing, in batch-type operations. This apparatus comprises a vertical reaction vessel inside a heating furnace, and a cover member which opens and closes the lower-end opening of the reaction vessel is loaded with a wafer holder thereon to hold numbers of wafers in tiers on shelves, and a predetermined heat treatment is performed after the wafer holder is carried into the reaction vessel by lifting the cover member.

In order to control the temperature inside the reaction vessel, an internal thermocouple 91 provided inside the reaction vessel 9 and an external thermocouple 92 provided near a heater 90 outside the reaction vessel 9 are used, as shown in FIG. 1, wherein the heat release value (electric power supply) of the heater 90 is controlled by a temperature controller 93 according to the comparison data between the detected temperature values and preset temperature values of these thermocouples 91 and 92. As shown in FIG. 2, the profile of the preset temperature value output by the temperature controller 93 is established wherein a temperature (Ta), e.g. in the vicinity of 600° C., is set when a wafer boat 94 loaded with wafers W is carried into the reaction vessel, and then the temperature value is increased to reach a predetermined processing temperature (Tb) which is to be maintained and then decreased to a predetermined temperature.

Hereinafter provided is an explanation of the structure of the temperature controller 93. As shown in FIG. 1, the temperature controller 93 comprises: a first computing unit 95 for carrying out a control focusing on the detected temperature value (the detected external temperature value) of the external thermocouple 92; a second computing unit 96 for cascade control; and a switch portion 97 to choose either output value of these computing units 95 and 96. Although the detected external temperature value may be used 100% for example, the first computing unit 95 may linear-interpolate the detected temperature value (the detected internal temperature value) detected by the internal thermocouple 91 and said detected external temperature value at a predetermined ratio to obtain the detected temperature value, compare this detected temperature value to the preset temperature value, and obtain the output value by integrating the deviation of the comparison result. Also, the second computing unit 96 compares said detected internal temperature value to the preset temperature value to obtain a setpoint signal by amplifying the deviation, and compares this setpoint signal to said detected external temperature value to obtain the output value by integrating the deviation.

In the process of raising the temperature Ta at carry in to reach the processing temperature Tb, firstly the power supply of the heater 90 is controlled according to the output value of the first computing unit 95, and then, by switching the switch portion 97, the power supply of the heater 90 is controlled according to the output value of the second computing unit 96.

The reason of switching the output values in this way is as follows. In the case that temperature is controlled according to the output value of the first computing unit 95, the temperature inside the reaction vessel 9 slowly rises when approaching the processing temperature Tb as a targeted temperature and converges to the temperature lower than the targeted temperature Tb due to the substantial influence of the detected external temperature value (the temperature of the heater 90). In the case that cascade control is performed on the other hand, due to the substantial influence of the detected internal temperature value, though cascade control aims to control the temperature inside the reaction vessel 9 to converges to the targeted temperature Tb, the power supply to the heater 90 is large as the deviation between the preset temperature value and the detected internal temperature value is large, which fact leads to an overshoot phenomenon that the temperature exceeds the targeted temperature Tb and then surges back to converge to the targeted temperature Tb. For this reason, in the heating process, a control (the external temperature control) is performed based on the output values of the first computing unit 95 at first, and when the temperature inside the reaction vessel 9 approaches the targeted temperature Tb to some extent, the cascade control is then performed.

The operator sets timing of switching from the control with the first computing unit 95 to the cascade control and is responsible for seeking a good timing which makes the detected internal temperature value become stable faster.

However, in some cases, when the control method is abruptly switched, the temperature might be distorted because of the impact of the switchover, and the distortion might discourage the early stabilization of the temperature. Also, when the timing of the switchover is too early, the large power supply to the heater 90 might cause overshoot due to the cascade control performed while the detected internal temperature value is still low, and the temperature inside the reaction vessel 9 takes long to become stable as a result. On the contrary, when the timing of the switchover is too late, the temperature inside the reaction vessel 9 increases slowly and the temperature inside the reaction vessel 9 takes long to become stable after all.

In operating a vertical heat treatment apparatus, the targeted values change depending on the kind of the heat treatment, wafers, etc., and in some cases, the temperature control may be adjusted after doing maintenance on the apparatus. Further, the labor to spot said timing is complicated and becomes a heavy burden to the operator since, for instance, the reaction vessel 9 has to actually be heated in order to find said timing, which heating needs to be repeated until the timing is spotted. Moreover, in a case that the adjustment by the operator is poor, the temperature inside the reaction vessel takes long to become stable, which fact decreases throughput.

DISCLOSURE OF INVENTION

The present invention owes to these circumstances and aims at providing an art of promptly stabilizing the temperature inside the reaction vessel at a targeted temperature upon performing a heat treatment on an object-to-be-treated inside the reaction vessel.

According to the present invention, a heat treatment method for performing a heat treatment by heating an inside of a reaction vessel using a heating unit provided outside said reaction vessel, an object-to-be-treated being positioned inside said reaction vessel, and by introducing a processing gas into said reaction vessel, is characterized by comprising the processes of:

interpolating a detected external temperature value and a detected internal temperature value at a predetermined ratio to obtain a first output value for the external temperature control on the basis of the deviation between the interpolated value and a preset temperature value;

calculating the deviation between the detected internal temperature value and the preset temperature value, and comparing the calculated deviation to the detected external temperature value to obtain a second output value for a cascade control; and linear-interpolating said first output value and said second output value to output the interpolated value as a control signal to the heat release value of the heating unit.

In this invention, a first arithmetical operation is for conducting a temperature control focusing on the detected temperature value at the heating unit, for example, and a second arithmetical operation is for conducting a temperature control focusing on the detected temperature value inside the reaction vessel, for example.

In a heating process, when a temperature control type is switched over to another temperature control type abruptly, the temperature inside the reaction vessel is distorted by the impact at the switchover, and spotting the right timing for the switchover is troublesome. However, by setting a region to have the interpolation ratio between the first output value and the second output value in the heating process as in the present invention, a region of mixture of the first output value and the second output value, i.e. a region (interpolation control region) in which both of a temperature control type and another temperature control type affect on the controlled temperature is formed so that the impact at the switchover can be restrained and the burden of spotting a good timing for the switchover can be reduced. In addition, the interpolation ratio of the second output value can be gradually increased in the heating process. The meaning of "gradually increased" includes a case that, in a heating initiated by using a temperature control type and another temperature control type to be used later, the ratio is not gradually changed in a intermediate process wherein both the temperature control types are interpolated, e.g. at a region of the interpolation ratio of 1:1. That is, a control region (interpolation control region) is intervened in which both temperature control types affect the controlled temperature without abruptly transferring from a temperature control type to another temperature control type.

More detailed explanations of the present invention are provided below. The first arithmetical operation is for comparing the detected temperature value at the heating unit, or the detected temperature value obtained by adding the detected temperature value at the heating unit to the detected temperature value inside the reaction vessel at a predetermined ratio, to the preset temperature value, to obtain the first output value corresponding to the deviation of the comparison results.

Further, the second arithmetical operation is for comparing the detected temperature value inside the reaction vessel to the preset temperature value to obtain a setpoint signal corresponding to the deviation of the comparison results, and also for comparing this setpoint signal to the detected temperature value at the heating unit to obtain the second output value corresponding to the deviation of the comparison results. The interpolation ratio of the second output value is 0%, for example, in the early stages of the heating process in which the interpolation ratio of the second output value is gradually increased, and the interpolation ratio of the second output value is 100% in the final stages of the process in which the interpolation ratio of the second output value is gradually increased. Further, change of the interpolation ratio of the second output value can be achieved by storing data indicating the correlation between the temperature difference of the detected internal temperature values and the preset temperature values and the interpolation ratio in a memory, for example, to adjust the interpolation ratio with reference to said temperature difference and the data.

Furthermore, the present invention includes a heat treatment apparatus. To be more precise, the heat treatment apparatus for performing a heat treatment by heating the inside of a reaction vessel using a heating unit provided outside said reaction vessel, an object-to-be-treated being positioned inside said reaction vessel, and by introducing a processing gas into said reaction vessel, is characterized by comprising:

a first computing unit to obtain a first output value by performing a first arithmetical operation based on a detected temperature value and a preset temperature value;

a second computing unit to obtain a second output value by performing a second arithmetical operation based on the detected temperature value and the preset temperature value, said second arithmetical operation being different from the first arithmetical operation;

a control signal output unit to output a interpolated value as a control signal to the heat release value of a heating unit, said interpolated value being obtained by interpolation between said first output value and said second output value; and an interpolation ratio adjusting unit to adjust the interpolation ratio in a manner that the interpolation ratio of the second output value in said output unit gradually increases as the internal temperature of said reaction vessel increases.

The heat treatment apparatus according to the present invention is characterized by further comprising:

an internal temperature detector to detect the temperature inside said reaction vessel;

an external temperature detector to detect the temperature of said heating unit;

a first computing unit to obtain a first output value by performing a first arithmetical operation based at least on the detected temperature value at the heating unit and a preset temperature value to conduct a temperature control focusing on the detected temperature value at the heating unit;

a second computing unit to obtain a second output value by performing a second arithmetical operation based at least on the detected temperature value inside the reaction vessel and the preset temperature value to conduct a temperature control focusing on the detected temperature value inside the reaction vessel;

an output unit to output a interpolated value as a control signal to the heat release value of a heating unit, said interpolated value being obtained by interpolation between said first output value and said second output value; and an interpolation ratio adjusting unit to adjust the interpolation ratio in a manner that the interpolation ratio of the second output value in said control signal output unit gradually increases as the internal temperature of said reaction vessel increases.

BEST MODE FOR CARRYING OUT THE INVENTION

Figure 1:
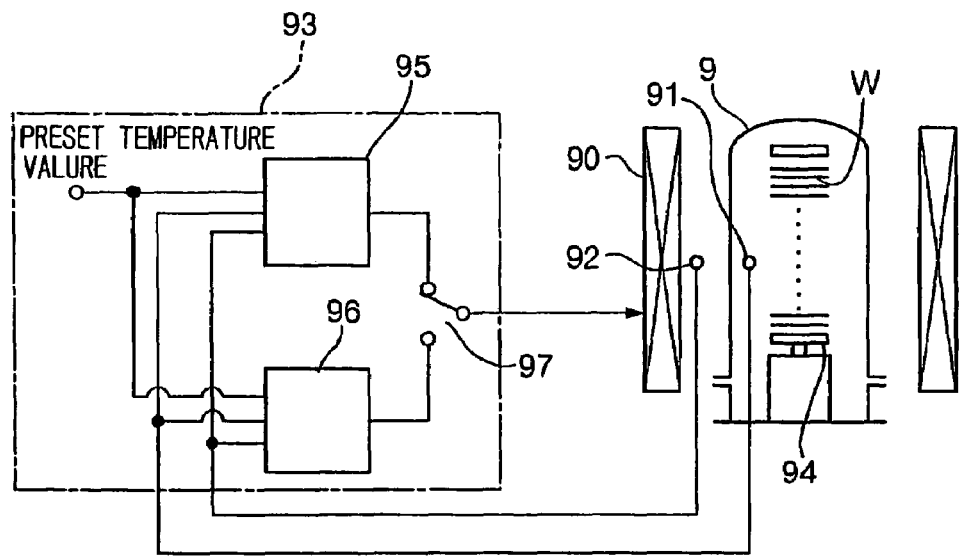
FIG. 1 is a block diagram showing an example of a temperature control system of a conventional vertical heat treatment apparatus.
Figure 2:
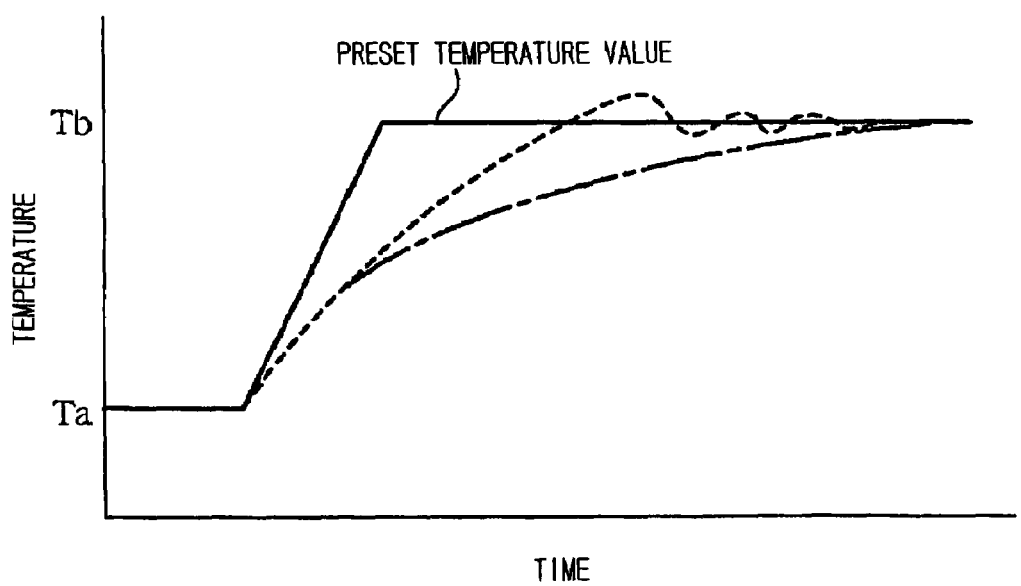
FIG. 2 is an explanatory diagram showing an appearance of change in the temperature trend inside a reaction vessel by a control method in a conventional vertical heat treatment apparatus.
Figure 3:
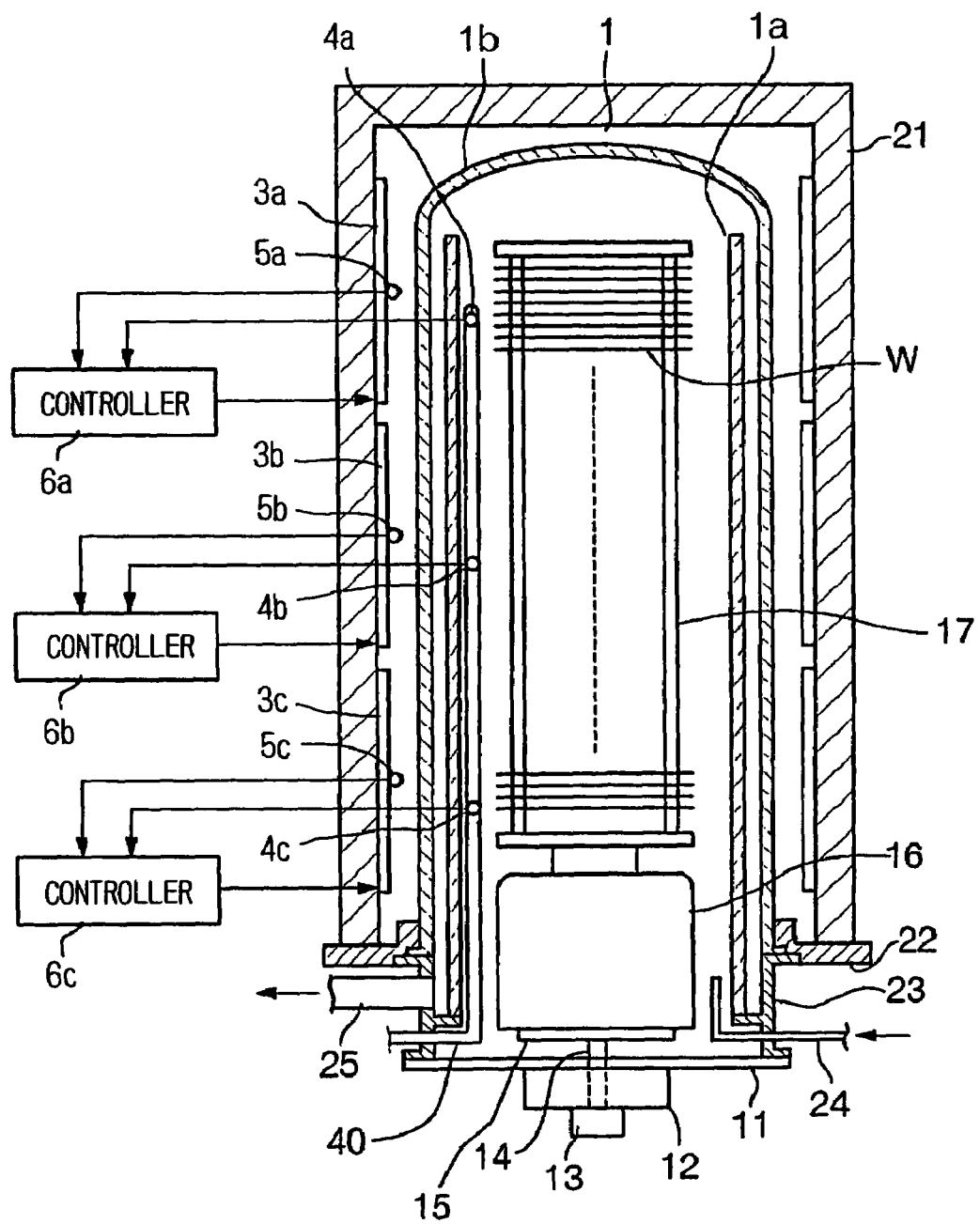
FIG. 3 is a longitudinal sectional view showing a vertical heat treatment apparatus according to an embodiment of the present invention.

FIG. 3 is an overall block diagram of the embodiment in which the present invention is applied to a vertical heat treatment apparatus.

First of all, a brief explanation will be provided about the overall structure of this vertical heat treatment apparatus. This apparatus comprises a dual-structured reaction tube 1 made of quartz for example, said reaction tube 1 comprising an inner tube 1a which is open at the both ends and an outer tube 1b which is closed at the upper end for example. A tubular heat insulation body 21 is provided surrounding the reaction tube 1 and secured onto a base body 22, and a heater divided for example into a plurality of heaters 3a, 3b and 3c composed of resistance heating element is provided vertically inside this heat insulation body 21. The number of division may be five for example, but this embodiment illustrates a threefold structure (3a, 3b and 3c) for the sake of simplicity. As the heaters 3a, 3b and 3c, ceramics such as transparent quartz pipes with an external diameter of ten-odd mm can be used which are corrugated and formed along a circumferential direction of the heat insulation body 21 for example, said ceramics having carbon wires sealed therein, said carbon wires being formed by weaving a plurality of bundles of high-purity carbon fiber with a wire diameter in the vicinity of 10 micron for example. Meanwhile, the heaters 3a, 3b and 3c are not limited to the above but may be metal elements, such as iron-tantalum-carbon alloy for example.

The inner tube 1a and the outer tube 1b are supported on the side of the lower portions on a tubular manifold 23, and this manifold 23 has a gas supply pipe 24 formed therethrough to open the supply port in the lower area inside the inner tube 1a, and also has an exhaust pipe 25 connected thereto with the side of one end connected to a vacuum pump, not shown. In this example, the inner tube 1a, the outer tube 1b and the manifold 23 constitute a reaction vessel.

Furthermore, a cover member 11 is formed in a manner to cover the lower-end opening of the manifold 23, and this cover member 11 is formed on a boat elevator 12. Above the cover member 11, a swivel 15 is mounted on a drive member 13 through a rotating shaft 14, and a wafer boat 17 which is a substrate holder is mounted on the swivel 15 through a heat insulation unit 16 in the form of a heat insulating mold for example. The wafer boat 17 is structured to enable wafers W, a large quantity of substrates, to be mounted in tiers on shelves.

A thin quartz tube 40 for thermocouples stands in a heat treatment atmosphere inside the inner tube 1a and pierces through the side surface of the manifold 23, and 3 pieces of internal thermocouples 4a, 4b and 4c are formed inside this quartz tube 40 as internal temperature detectors for the temperatures in a heat treatment atmosphere heated by each of the threefold-divided heaters 3a, 3b and 3c to be respectively detected, for example. Moreover, external thermocouples 5a, 5b and 5c as external temperature detectors are formed near the heaters 3a, 3b and 3c between the inner tube 1a and the outer tube 1b for the temperature of each of the heaters 3a, 3b and 3c to be detected respectively.

Further, controllers 6a, 6b and 6c are formed to control the heat release value of each fold of the heaters 3a, 3b and 3c respectively, and each of the controllers 6a, 6b and 6c is structured to control the heat release value by controlling the electric power supply of the heaters 3a, 3b and 3c based on the detected temperature values of the internal thermocouples 4a, 4b and 4c, the detected temperature values of the external thermocouples 5a, 5b and 5c and the preset temperature values, for example. Meanwhile, signal lines of the internal thermocouples 4a, 4b and 4c are extracted from the quartz tube 40 outside the manifold 23, but are illustrated as in FIG. 3 for the sake of simplicity.

Figure 4:
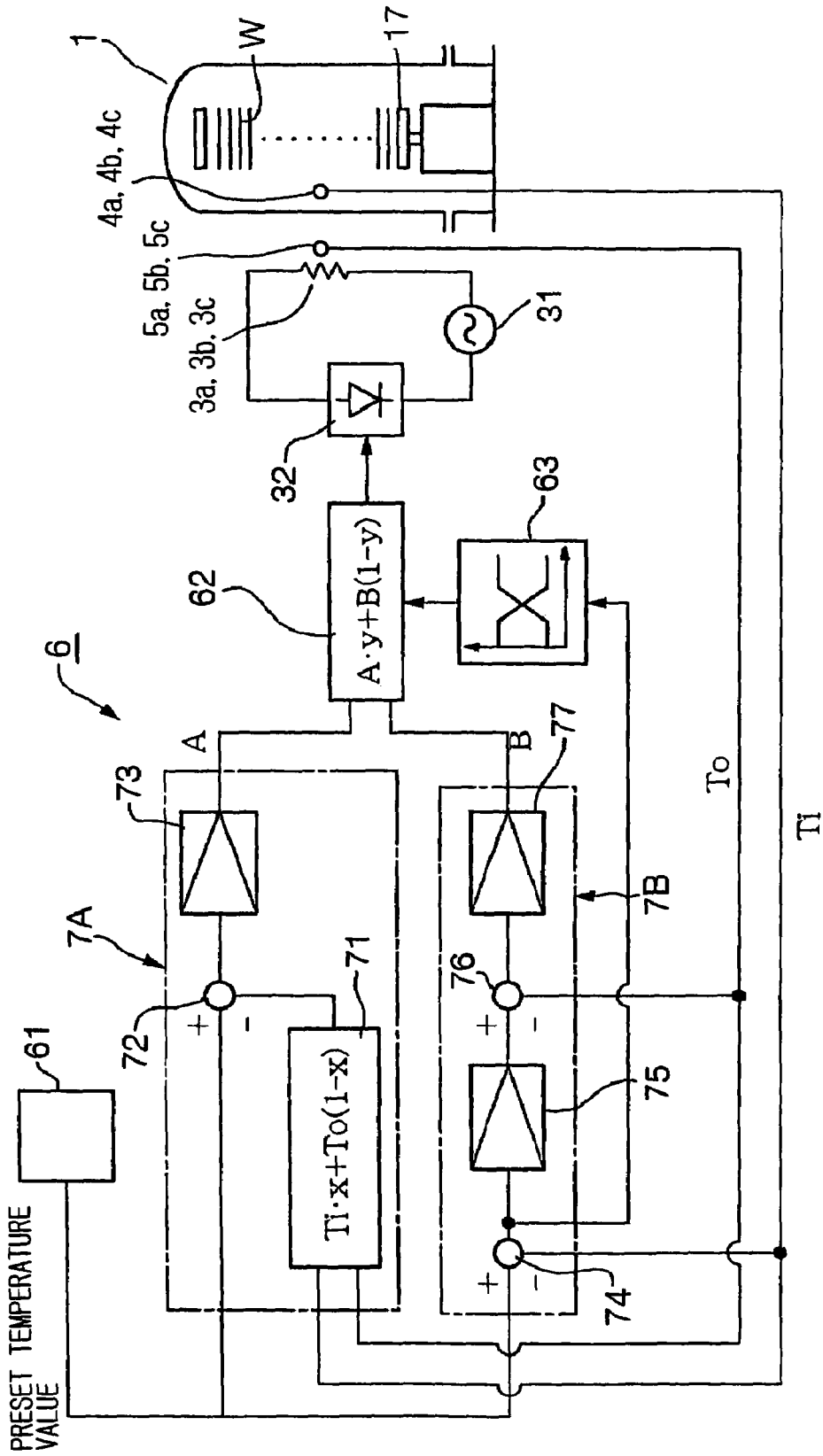
FIG. 4 is a block diagram showing a controller employed in an embodiment of the present invention.

Since each of the controllers 6a, 6b and 6c has the same structure, one is chosen for explanation with reference to FIG. 4. The controller 6 comprises a preset temperature value output unit 61 to output preset temperature values of the heat treatment atmosphere inside the inner tube 1a, a first computing unit 7A, a second computing unit 7B, a control signal output unit 62 and a interpolation ratio adjusting unit 63. The preset temperature value output unit 61 functions as a preset temperature value output unit to output preset temperature values of the heat treatment atmosphere inside the inner tube 1a, and stores a temperature pattern consisting of a set of elements of the preset temperature value at each timing. As shown by a solid line in FIG. 5, this temperature pattern is arranged in a way that a preset temperature value T1 is output at loading of a wafer W, increases toward the preset temperature value T2 as a targeted temperature value (processing temperature) after the loading of a wafer W, and decreases toward T1 after completion of the process.

The first computing unit 7A in FIG. 4 interpolates a detected internal temperature value Ti and a detected external temperature value To with a predetermined (fixed) ratio. That is, given x ($0 \leq x \leq 1$) as an interpolation ratio (x is fixed), the first computing unit 7A comprises: a interpolation part 71 to calculate $Ti \cdot x + To \cdot (1-x)$; a comparison operation part 72 to compare the output value of the interpolation part 71 to a preset temperature value and calculate the deviation;

and a regulation part 73 to output a first output value A by regulating the comparison data (actuating signal) from the comparison operation part 72. Since the first computing unit 7A functions to control the temperature under the significant influence of the detected external temperature value To for example, the interpolation ratio of To may be set for a given value, preferably 50% to 100%.

The second computing unit 7B comprises: a comparison operation part 74 to compare the detected internal temperature value Ti to a preset temperature value and calculate the deviation; a regulation part 75 to generate control signals for the next step by regulating the deviation calculated by the comparison operation part 74; a comparison operation part 76 to interpret the control signal from this regulation part 75 as a setpoint signal, compare said setpoint signal to the detected external temperature value To and calculate the deviation; and a regulation part 77 to output a second output value B by regulating the deviation calculated by this comparison operation part 76. Said regulation parts 73, 75 and 77 are equipped with amplification parts to perform integral action for example.

The control signal output unit 62 interpolates an output value of the first computing unit 7A (first output value) and an output value of the second computing unit 7B (second output value) and outputs the value obtained as a result of the interpolation (referred as "interpolated value") as a control signal for the heat release value of a heater 5, i.e. as a control signal, in this example, for a switch portion 32 to control electric power supplied from a power section 31 to the heater 3. To be more precise, this control signal output unit 62 functions to calculate A·y+B (1 −y), given y ($0 \leq y \leq 1$) as an interpolation ratio.

Figure 6A:
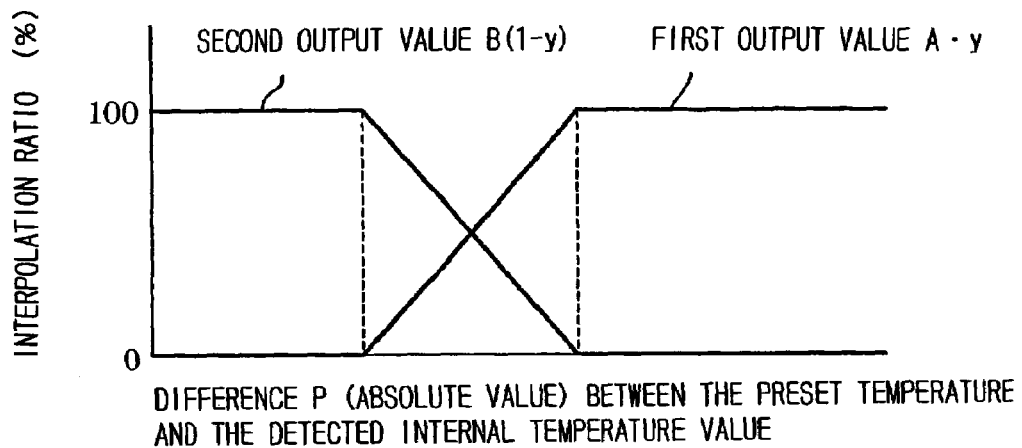
FIG. 6A is an explanatory diagram showing an example of data stored in a memory section employed in an embodiment of the present invention.
Figure 6B:
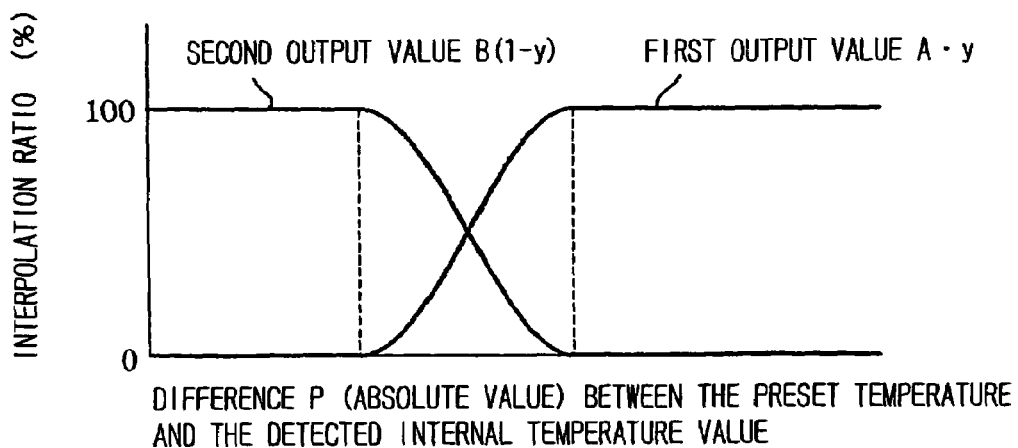
FIG. 6B is an explanatory diagram showing an example of data stored in a memory section employed in an embodiment of the present invention.

The interpolation ratio adjusting unit 63 includes a memory section storing a table showing correlation of a temperature difference (absolute value) P between the preset temperature value and the detected internal temperature value Ti and an interpolation ratio y, and functions for example to retrieve the interpolation ratio y corresponding to the deviation calculated by the comparison operation part 74 from the table for use as an interpolation ratio y of the control signal output unit 62. FIG. 6A is a diagram showing the image of the table showing correlation of the temperature difference P and y, and the interpolation ratio of each of the first output value A and the second output value B is shown in the diagram. When the detected internal temperature value Ti is small (when the temperature difference P is large), y is "1" and the first output value A is used 100% as a control signal. Then when the detected internal temperature value Ti increases (when the temperature difference P decreases), y slowly becomes smaller, and when the detected internal temperature value Ti further increases to approach the preset temperature value, y becomes "0" and the second output value B is used 100% as a control signal. y may change linearly in the correlation of the temperature difference P and the interpolation ratio y as shown in FIG. 6A, but may also change in a curve as shown in FIG. 6B.

Although the controller 6 actually is equipped with a CPU, an ROM storing a program, a memory storing preset temperature values, etc. for example and each calculation is performed by a program in a software-based manner, FIG. 4 illustrates the image structure in a frame format.

Figure 5:
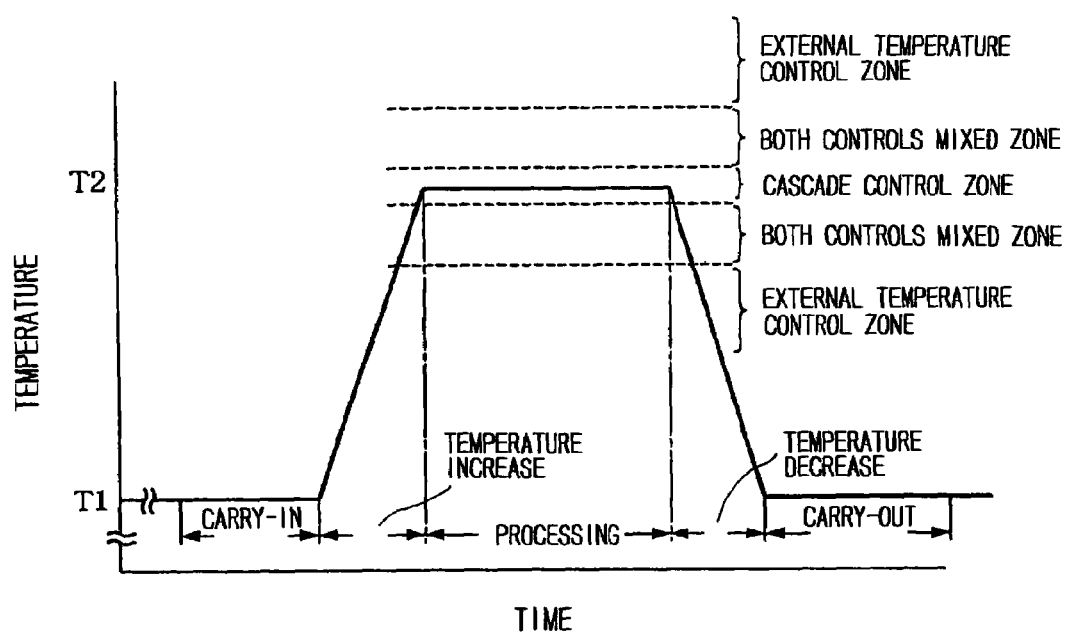
FIG. 5 is an explanatory diagram showing correlation between the patterns of preset temperature values and temperature control methods according to an embodiment of the present invention.

Next, an explanation will be provided about operations of the above-mentioned embodiment. Firstly, numbers of wafers as objects to be treated are transferred to the wafer boat 17 on the side below the reaction vessel (the reaction tube 1 and the manifold 23) and are held in tiers on shelves, and then the wafer boat 17 is carried into the reaction vessel by lifting the boat elevator 12. At this point, the preset temperature value is T1 as shown in FIG. 5, in the vicinity of 600° C. for example, and the preset temperature value increases toward the preset temperature value T2, 800° C. for example, after the wafer boat 17 is carried in.

Figure 7:
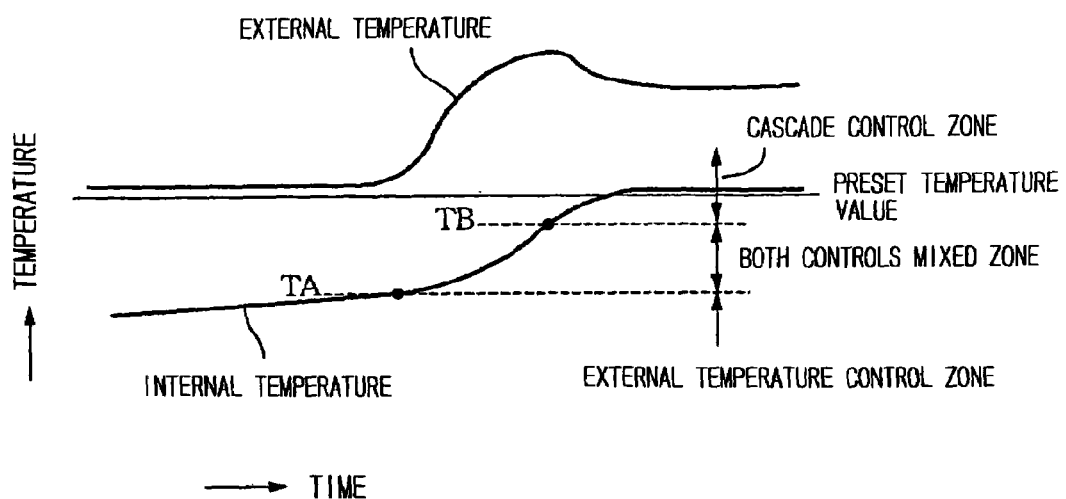
FIG. 7 is an explanatory diagram showing trends of detected internal temperature values and detected external temperature values in a case that a temperature control is performed according to the method in an embodiment of the present invention.

Exemplified as follows shows relationship of the temperature difference (absolute value) P between the preset temperature value and the detected internal temperature value Ti and the interpolation ratio y: the first output value A is used 100% when the temperature difference P is more than 6° C.; the first output value A and the second output value B are interpolated in accordance with the table shown in FIG. 6A when the temperature difference P is 3° C. to 6° C.; and the second output value B is used 100% when the temperature difference P is less than 3° C. In this case, as shown in FIG. 7, the first output value A is output from the control signal output unit 62 to be 100% used as a control signal to control the electric power supply from the heaters 3a, 3b and 3c until the detected internal temperature value Ti reaches 794° C. (TA) which makes the temperature difference P to be 6° C.

Since the control performed with the first output value A is an "external temperature control," so to speak, by focusing on the detected external temperature values, increase of the temperature becomes slow as the internal temperature of the reaction vessel comes near to the targeted temperature. When the internal temperature (detected internal temperature value Ti) reaches 794° C. (TA) or above, the ratio of the first output value A becomes smaller and the ratio of the second output value B becomes larger as the temperature rises. Though the control performed with the second output value B is a "cascade control" by focusing on the detected internal temperature value, the cascade control occupies a small portion of the interpolated control region at the beginning and so the internal temperature is not likely to surge toward the targeted temperature. However, the internal temperature becomes likely to increase rapidly toward the targeted temperature because the portion occupied by the cascade control becomes larger as the temperature increases. Although the internal temperature is likely to increase rapidly toward the targeted temperature when the portion of the cascade control becomes 100% over 797° (TB), the internal temperature becomes stable promptly at the targeted temperature without substantial overshooting as the internal temperature would come quite close to the targeted temperature at this stage. After the internal temperature becomes stable at the processing temperature as the targeted temperature, a predetermined processing gas, e.g. a film deposition gas, is supplied from the gas supply pipe 24 into the reaction vessel and a predetermined degree of vacuum is maintained with a vacuum pump, not shown, through the exhaust pipe 25, and then a heat treatment, e.g. a film deposition, is performed on a wafer with the wafer boat 17 rotating by the drive member 13. After that, the temperature inside the reaction vessel decreases as the preset temperature value becomes smaller, and the boat elevator 12 is brought down to carry the wafer boat 17 out.

According to the above-stated embodiment, instead of abruptly switching from the control focusing on the detected external temperature value to the cascade control focusing on the detected internal temperature value, a mixed state is produced in which both the controls affect the temperature control to gradually switch over to the cascade control so that the impact of the switch (temperature distortion) can be restrained, the temperature can promptly become stable at the targeted temperature, and throughput can be enhanced.

In addition, when the switching timing is set as a point as in conventional ways, the heating adjustment becomes difficult due to the position of the one point having a great influence on the state of heating. However, in a case that the switching patterns are determined by intervention of the mixed state of both the temperature control methods as shown in FIGS. 6A and 6B for example, self-adjustment can be achieved in any heating patterns for any targeted temperatures, and thus adjusting operation is done with less burden.

In the above-mentioned embodiment, the state that the output value A is 100% used is switched to the state that the second output value B is 100% used. However, the scope of the present invention also includes the case that, firstly, a control method in which the first output value A is interpolated with the second output value B complimentarily (by occupying a relatively small portion) is used, and secondly, the interpolation ratio of the second output value B gradually increases to be settled finally in another controlling method in which the second output value B is interpolated with the first output value A complimentarily (by occupying a relatively small portion). Also, the change patterns of the interpolation ratio is not limited to the patterns shown in FIGS. 6A and 6B but a stepwise increase of the interpolation ratio of the second output value B may also be included, for example. Additionally, the present invention is not limited to the use of the batch-type heat treatment apparatus but may be embodied in a single heat treatment apparatus.

EMBODIMENT

Figure 8:
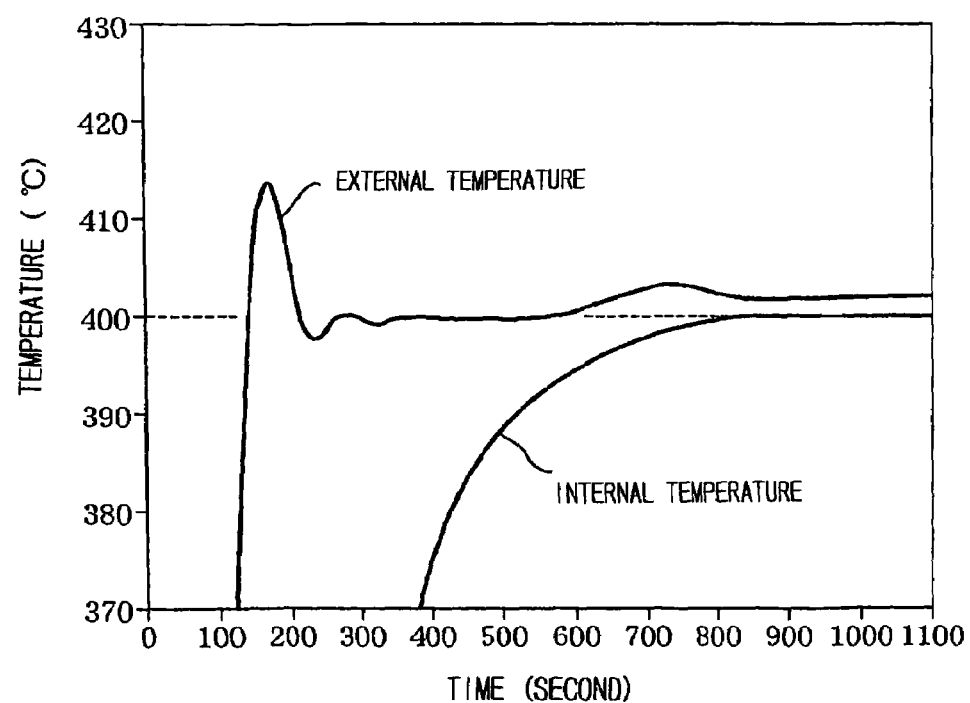
FIG. 8 is an explanatory diagram showing the result of a simulation conducted to verify the effect of the present invention.

FIG. 8 shows the result of a simulation conducted using computers. This example shows the detected internal temperature values and the detected external temperature values in a case that the internal temperature of the, reaction vessel is increased from a room temperature to 400° C. as a targeted temperature, under the condition that the first output value A is used 100% when the temperature difference P is greater than 10° C., the first output value A and the second output value B are interpolated according to the table shown in FIG. 6A for example when the temperature difference P is 2° C. to 10° C., and the second output value B is used 100% when the temperature difference P is smaller than 2° C.

Figure 9:
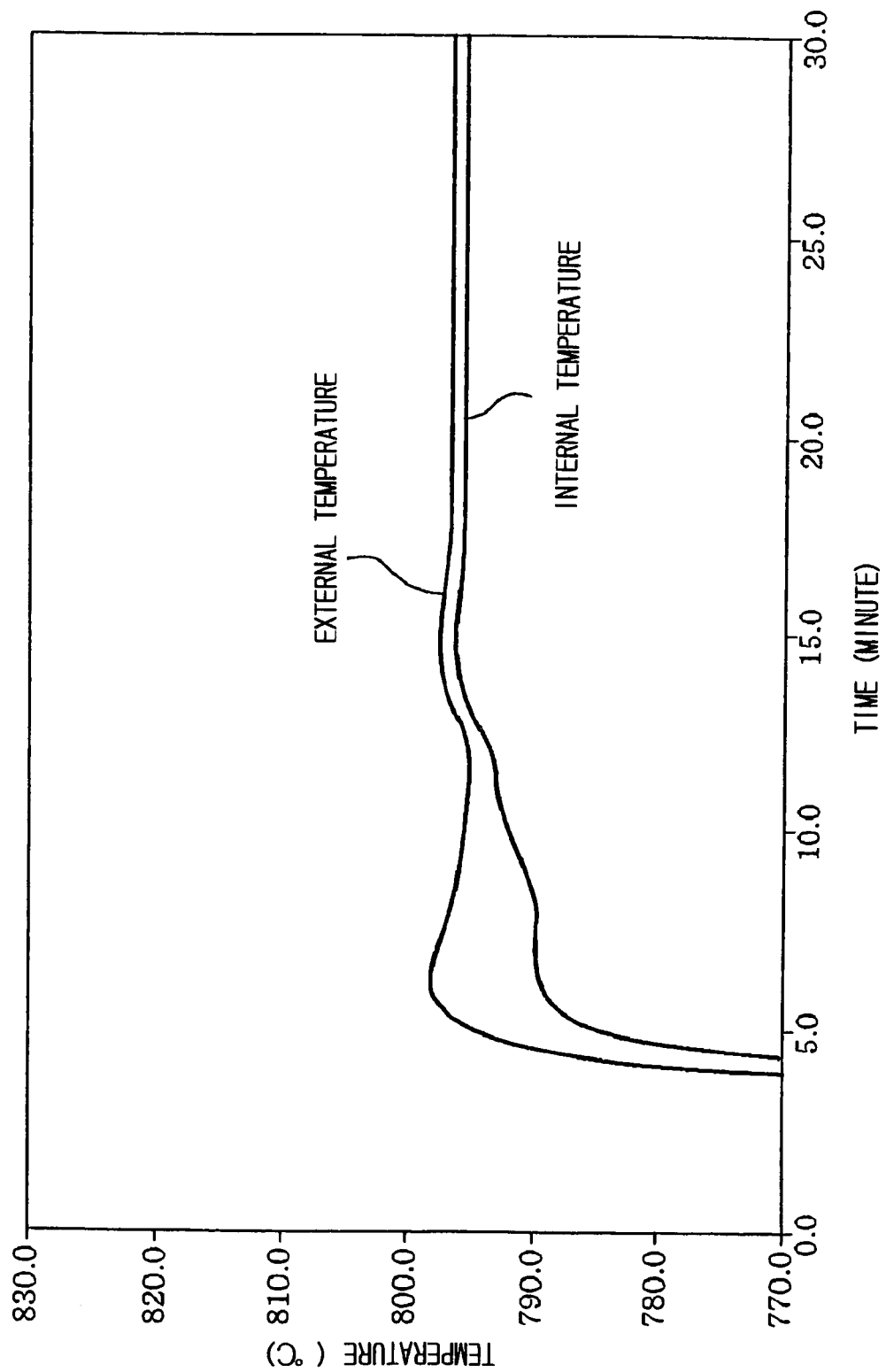
FIG. 9 is an explanatory diagram showing the experimental result to verify the effect of the present invention.

Further, FIG. 9 shows the result of heating the internal temperature of the reaction vessel with an actual vertical heat treatment apparatus. This example shows the detected internal temperature values and the detected external temperature values in a case that the internal temperature of the reaction vessel is increased from a room temperature to in the vicinity of 800° C. as a targeted temperature, under the condition that the first output value A is used 100% when the temperature difference P is greater than 10° C., the first output value A and the second output value B are interpolated according to the table shown in FIG. 6A for example when the temperature difference P is 2° C. to 10° C., and the second output value B is used 100% when the temperature difference P is smaller than 2° C.

Both these examples prove that the internal temperature promptly becomes stable at a targeted value without causing overshoot.

According to the present invention, as stated above, when a temperature control type is switched over to another temperature control type upon heating the inside of the reaction vessel to reach a targeted temperature, both temperature control methods form an interpolation control region, affecting the controlled temperature, so that the impact (temperature distortion) at the switchover of temperature control types can be restrained, the temperature can promptly become stable at the targeted temperature, and throughput can be enhanced. Furthermore, the burden of spotting the right timing for the switchover as in the conventional ways will be reduced as a result of the restraint of the impact at the switchover.

The invention claimed is:

1. A heat treatment method for performing a heat treatment by heating an inside of a reaction vessel using a heating unit provided outside said reaction vessel, an object-to-be-treated being positioned inside said reaction vessel, and by introducing a processing gas into said reaction vessel, the method comprising:
    interpolating a detected external temperature value of the reaction vessel and a detected internal temperature value of the reaction vessel at a predetermined ratio to obtain a first output value for external temperature control on the basis of the deviation between the interpolated value and a preset temperature value;
    calculating the deviation between the detected internal temperature value and the preset temperature value, and comparing the calculated deviation to the detected external temperature value to obtain a second output value for a cascade control; and
    linear-interpolating said first output value and said second output value to output the interpolated value as a control signal to the heat release value of the heating unit.

2. A heat treatment method for performing a heat treatment by heating an inside of a reaction vessel using a heating unit provided outside said reaction vessel, an object-to-be-treated being positioned inside said reaction vessel, and by introducing a processing gas into said reaction vessel, the method comprising:
    performing an external temperature control in an early stage of the heating process using a first output value which is obtained by interpolating a detected external temperature value of the reaction vessel and a detected internal temperature value of the reaction vessel at a predetermined ratio and determining a deviation between the interpolated value and a preset temperature value;
    performing a cascade control in a final stage of the heating process using a second output value which is obtained by calculating the deviation between the detected internal temperature value and the preset temperature value and comparing the calculated deviation to the detected external temperature; and
    performing an interpolation control, between the external temperature control using said first output value and the cascade control using said second output value, by interpolating the first output value and the second output value.

3. A heat treatment method according to claim 1 or 2, wherein a predetermined interpolation ratio is used for the interpolation between said first output value and said second output value, said interpolation ratio corresponding to the temperature difference between the detected internal temperature value and the preset temperature.

4. A heat treatment method according to claim 3, characterized in that said interpolation ratio is at least one fixed value.

5. A heat treatment method according to claim 3, characterized in that said interpolation ratio changes corresponding to the temperature difference between the detected internal temperature value and the preset temperature.

6. A heat treatment method according to claim 1 or 2, characterized in that the interpolation ratio of said second output value is 0% in an early stage of the heating process.

7. A heat treatment method according to claim 1 or 2, characterized in that the interpolation ratio of said second output value is 100% in a final stage of the heating process.

8. A heat treatment apparatus for performing a heat treatment by heating an inside of a reaction vessel using a heating unit provided outside said reaction vessel, an object-to-be-treated being positioned inside said reaction vessel, and by introducing a processing gas into said reaction vessel, the apparatus comprising: a first computing unit to obtain a first output value by performing a first arithmetical operation based on a deviation between a detected temperature value outside the reaction vessel, or a detected temperature value obtained by interpolation between the detected temperature value outside the reaction vessel and a detected temperature value inside the reaction vessel and a preset temperature value;

a second computing unit to obtain a second output value by performing a second arithmetical operation based on the deviation between the detected temperature value inside the reaction vessel and the preset temperature value, said second arithmetical operation being different from the first arithmetical operation;

a control signal output unit to output a interpolated value as a control signal to the heat release value of a heating unit, said interpolated value being obtained by interpolation between said first output value and said second output value; and an interpolation ratio adjusting unit to adjust the interpolation ratio in a manner that the interpolation ratio of the second output value in said control signal output unit gradually increases as the internal temperature of said reaction vessel increases.

9. A heat treatment apparatus for performing a heat treatment by heating an inside of a reaction vessel using a heating unit provided outside said reaction vessel, an object-to-be-treated being positioned inside said reaction vessel, and by introducing a processing gas into said reaction vessel, the apparatus comprising:

an internal temperature detector to detect the temperature inside said reaction vessel;

an external temperature detector to detect the temperature of said heating unit;

a first computing unit to obtain a first output value by performing a first arithmetical operation based at least on the detected temperature value at the heating unit and a preset temperature value to conduct a temperature control based on the detected temperature value at the heating unit;

a second computing unit to obtain a second output value by performing a second arithmetical operation based at least on the detected temperature value inside the reaction vessel and the preset temperature value to conduct a temperature control based on the detected temperature value inside the reaction vessel;

a control signal output unit to output a interpolated value as a control signal to the heat release value of a heating unit, said interpolated value being obtained by interpolation between said first output value and said second output value; and an interpolation ratio adjusting unit to adjust the interpolation ratio in a manner that the interpolation ratio of the second output value in said control signal output unit gradually increases as the internal temperature of said reaction vessel increases.

10. A heat treatment apparatus according to claim 8 or 9, wherein said first computing unit compares the detected temperature value at the heating unit, or the detected temperature value obtained by interpolation between the detected temperature value at the heating unit and the detected temperature value inside the reaction vessel, to the preset temperature value, and performs arithmetical operations to obtain the first output value corresponding to the deviation of the comparison results.

11. A heat treatment apparatus according to claim 8 or 9, wherein the second computing unit compares the detected temperature value inside the reaction vessel to the preset temperature value, obtains a setpoint signal corresponding to the deviation of the comparison results and compares this setpoint signal to the detected temperature value at the heating unit, and performs arithmetical operations to obtain the second output value corresponding to the deviation of the comparison results.

12. A heat treatment apparatus according to claim 8 or 9, wherein the interpolation ratio adjusting unit comprises a means for storing data indicating the correlation between the difference of the detected temperature values inside the reaction vessel and the preset temperature values and the interpolation ratio.

13. A heat treatment apparatus according to claim 8 or 9, wherein the interpolation ratio adjusting unit is structured in a manner that the interpolation ratio of the second output value gradually increases from 0%.

14. A heat treatment apparatus according to claim 8 or 9, wherein the interpolation ratio adjusting unit is structured in a manner that the mixing ratio of the second output value gradually increases toward 100%.

* * * * *